United States Patent [19]

Hisamune

[11] Patent Number: 5,076,204
[45] Date of Patent: Dec. 31, 1991

[54] APPARATUS FOR PRODUCING SEMICONDUCTOR DEVICE

[75] Inventor: Yoshiaki Hisamune, Tokyo, Japan

[73] Assignee: NEC Corporation, Japan

[21] Appl. No.: 413,978

[22] Filed: Sep. 28, 1989

[30] Foreign Application Priority Data

Sep. 29, 1988 [JP] Japan ................................. 63-24'027

[51] Int. Cl.$^5$ ............................................. C23C 16/00
[52] U.S. Cl. .................................... 118/719; 118/722;
118/725; 118/501
[58] Field of Search .................... 118/719, 722, 50.1,
118/725

[56] References Cited

U.S. PATENT DOCUMENTS 4,430,149 2/1984 Berkman ............................. 118/719
4,587,002 5/1986 Bok ..................................... 118/719

OTHER PUBLICATIONS

Rosler, *Automation in CVD Processing*, Solid State Technology, Jul. 1977, pp. 27–33.

Primary Examiner—Richard Bueker
Attorney, Agent, or Firm—Laff, Whitesel, Conte & Saret

[57] ABSTRACT

An apparatus for producing semiconductor devices. A first automatic carrying system operates for taking from a lead frame tray a lead frame which mounts thereon semiconductor chips and for setting the lead frame on the suscepter. A thin film forming device operates for forming an insulating film on a surface of the lead frame disposed on the suscepter. A second automatic carrying system operates for taking from the suscepter the lead frame formed with the insulating film and for setting the lead frame into another lead frame tray. A transferring device operates for transferring the lead frame disposed on the suscepter from the first automatic carrying system through the thin film forming device to the second automatic carrying system.

8 Claims, 12 Drawing Sheets

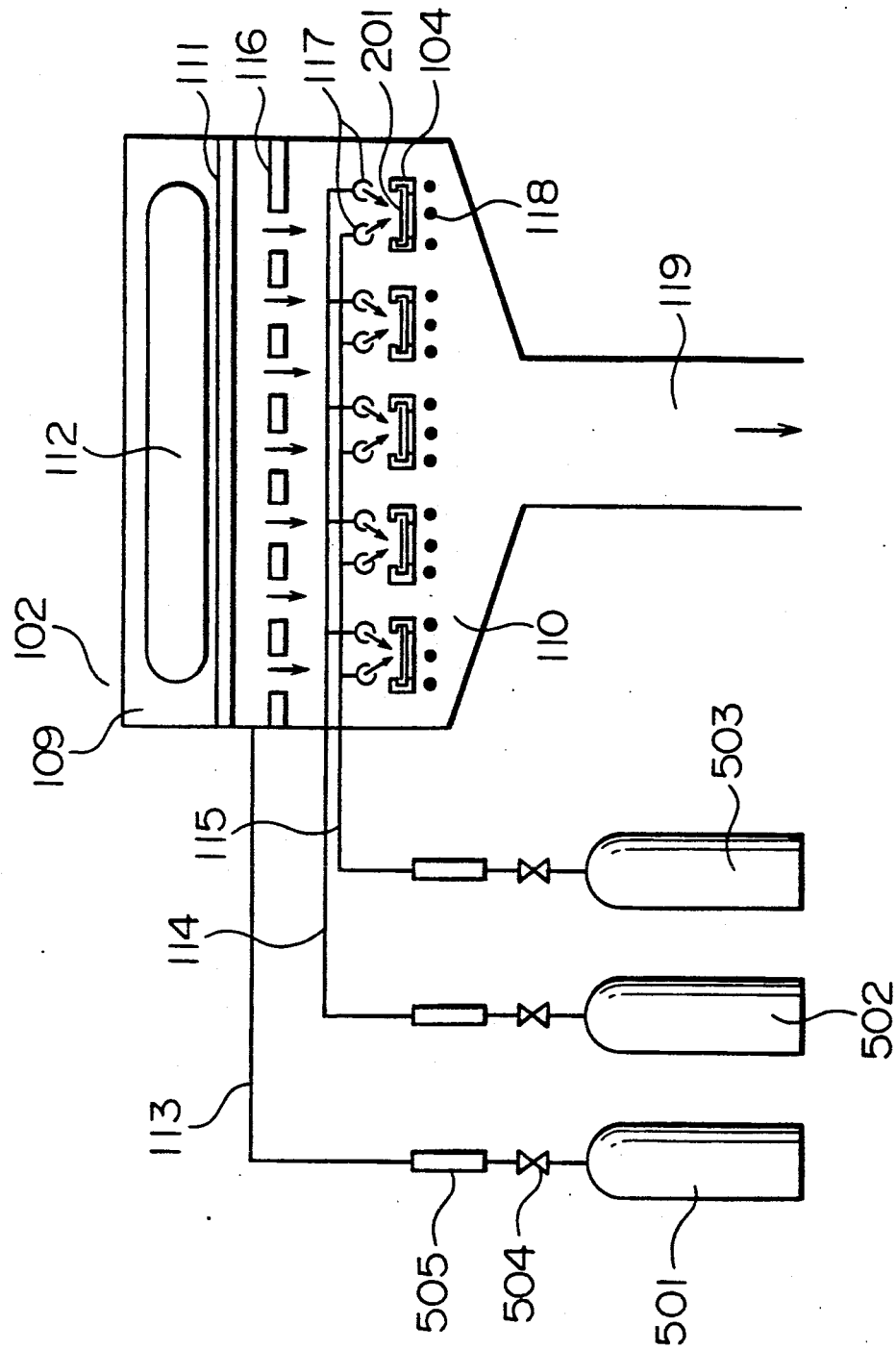

APPARATUS FOR PRODUCING SEMICONDUCTOR DEVICE

BACKGROUND OF THE INVENTION

The present invention relates to apparatus for producing semiconductor devices, and more specifically relates to apparatus of the type for coating insulating films on a surface of semiconductor chips mounted on a lead frame to produce semiconductor device.

In general, a semiconductor device is susceptible to thermal, chemical and physical stress from the environment which causes a change of electrical characteristics thereof, thereby generating reliability problems. Especially, in the production of semiconductor devices of the plastic encapsulation type, there is observed a serious problem that a pad is corroded at a junction between an aluminium electrode of the semiconductor device and a metal lead. In view of this, after a small lead is connected between the semiconductor device electrodes and the external lead lines, a protective film is formed on the surface of the semiconductor device, the formation being made at low temperature below 400° C. so as to improve moisture resistance.

Conventionally, the method of forming such a protective film includes forming a silicon oxide film ($SiO_2$) by a vapor-deposition-method by using monosilane ($SiH_4$) and ozone ($O_3$) (for example, Japanese Patent Publication No. 33914/1974), and forming a silicon nitride film ($Si_3N_4$) by vapor-deposition method with irradiating ultraviolet ray to a gas mixture of monosilane and ammonia ($NH_3$) added with a photosensitizer composed of mercury (Hg) (for example, J. W. Peter et al. Solid State Technology, Sep. 1980, pp. 121-126).

As desclosed in the above references related to the protective film forming technology, the thin film forming apparatus is comprised of a CVD apparatus used in preceding steps of the semiconductor fabrication process, i.e., in a water production process prior to the division of the semiconductor wafer into chips. Hence, the conventional apparatus does not suitably provide for an assembling process in which lead frames mounting semiconductor chips are treated as a lot to carry out a batch process working, thereby causing a drawback in that the productive fabrication process cannot be carried out.

SUMMARY OF THE INVENTION

An object of the present invention is to, therefore, provide apparatus for forming protective films through a use of an assembly process.

According to the present invention, the apparatus for producing the semiconductor devices is comprised of first automatic carrying means for taking a lead frame mounting semiconductor chips from a lead frame tray and setting the lead frame on a guide member. Thin film forming means forms an insulating film on the lead frame set on the guide member. A second automatic carrying means takes the lead frame formed with the insulating film and stores the same into another lead frame tray. A transferring means transfers the lead frame set on the guide member from the first carrying means to the second carrying means through the thin film forming means.

BRIEF DESCRIPTION OF THE DRAWINGS

FIG. 5 is a sectional view of an photo-CVD device taken along line B—B' of FIG. 1;

DETAILED DESCRIPTION OF EMBODIMENTS

Next, the present invention is described with reference to the drawings.

Figure 1A:
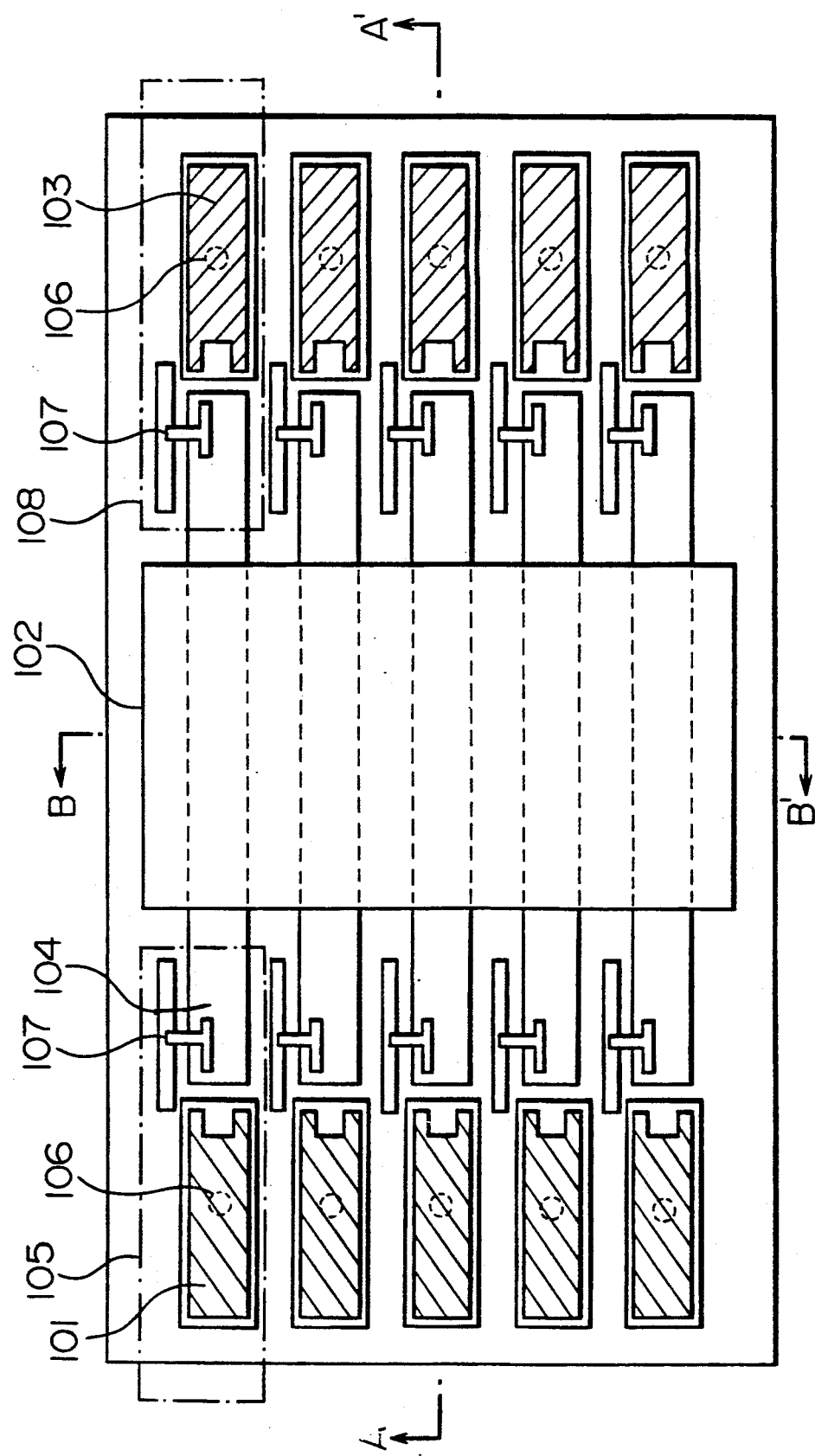
FIG. 1(a) is a plan view of a first embodiment according to the present invention.
Figure 1B:
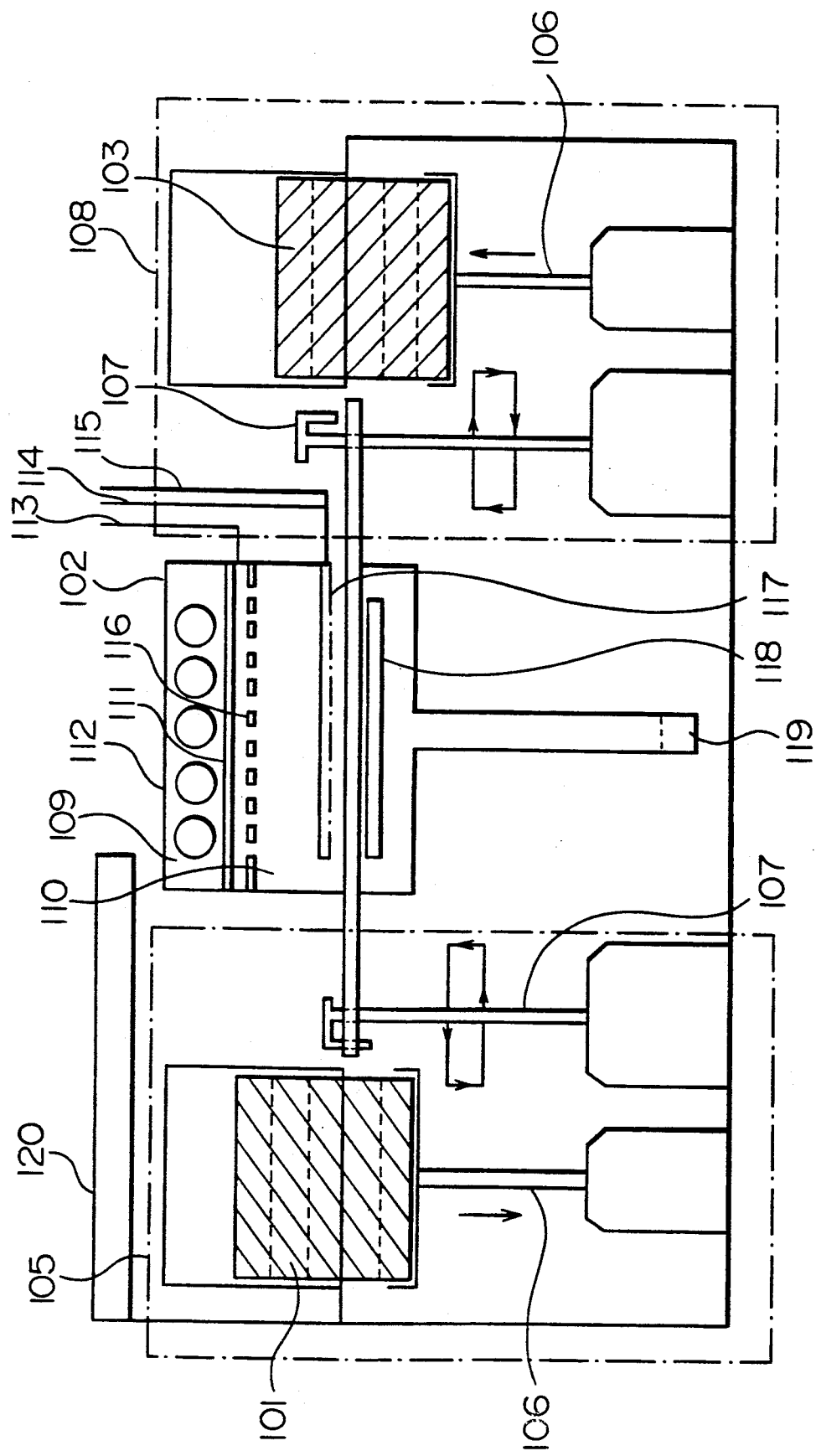
FIG. 1(b) is a sectional view taken along line A—A' of FIG. 1(a)

FIGS. 1(a) and 1(b) are a plan view and a sectional view taken along line A—A', respectively, showing a first embodiment of the invention. Further, FIGS. 2-5 show detailed views of the first embodiment.

Referring to FIGS. 1(a) and 1(b) numeral 101 denotes a lead frame tray storing a lead frame finished in bonding step, numeral 102 denotes a photo-CVD device for forming an insulating film on the lead frame, and numeral 103 denotes a lead frame tray for storing a lead frame formed with the insulating film. Numeral 104 denotes a suscepter or guide having a rail shape which is operative to slide or shift a lead frame mounting semiconductor chips in order to transfer the same from the lead frame tray 101 through the photo-CVD device 102 to the other lead frame tray 103. Numeral 105 denotes an automatic carrying system (I) for taking a lead frame from the lead frame tray 101 and setting the same on the guide 104.

The automatic carrying system (I) is comprised of a shaft 106 for moving a lead frame tray 101 in vertical direction, and an arm 107 for feeding a lead frame from the lead frame tray 101 to the guide 104 in horizontal direction. In similar manner, numeral 108 denotes another automatic carrying system (II) for taking a lead frame from the guide 104 and storing it into the lead frame tray 103. The system (II) is comprised of a shaft 106 for moving the lead frame tray 103 in the vertical direction, and an arm 107 for feeding a lead frame from the guide 104 to the lead frame tray 103 in the horizontal direction.

In this first embodiment, as shown in FIG. 1 (a), there are provided five process lines of the same type each comprised of the lead frame trays 101 and 103, guide 104, automatic carrying system (I) 105 and automatic carrying system (II) 108. Further, numerals 109 to 119 denote components of the photo-CVD device 102. Numeral 109 denotes a lamp room, numeral 110 denotes a reaction chamber, numeral 111 denotes a synthesized quartz window, numeral 112 denotes a low pressure mercury-vapor lamp, numeral 113 denotes a pipe for feeding inert gas ($N_2$), numeral 114 denotes a silane gas ($SiH_4$) feeding pipe, numeral 115 denotes an oxygen gas ($O_2$) feeding pipe, numeral 116 denotes another synthesized quartz window formed with a plurality of tiny openings, numeral 117 denotes a reactive gas injecting pipe, numeral 118 denotes a heater, and numeral 119 denotes an exhaust opening.

As will be described hereafter, the photo-CVD device 102 operates to grow silicon oxide film ($SiO_2$) on a surface of a lead frame disposed on the guide 104 within the reaction chamber 110 and under atmospheric pressure. Further, numeral 120 denotes a clean bench which maintains clean air to prevent dust from being depositing onto the surface of the lead frame before forming the $SiO_2$ film.

Figure 2:
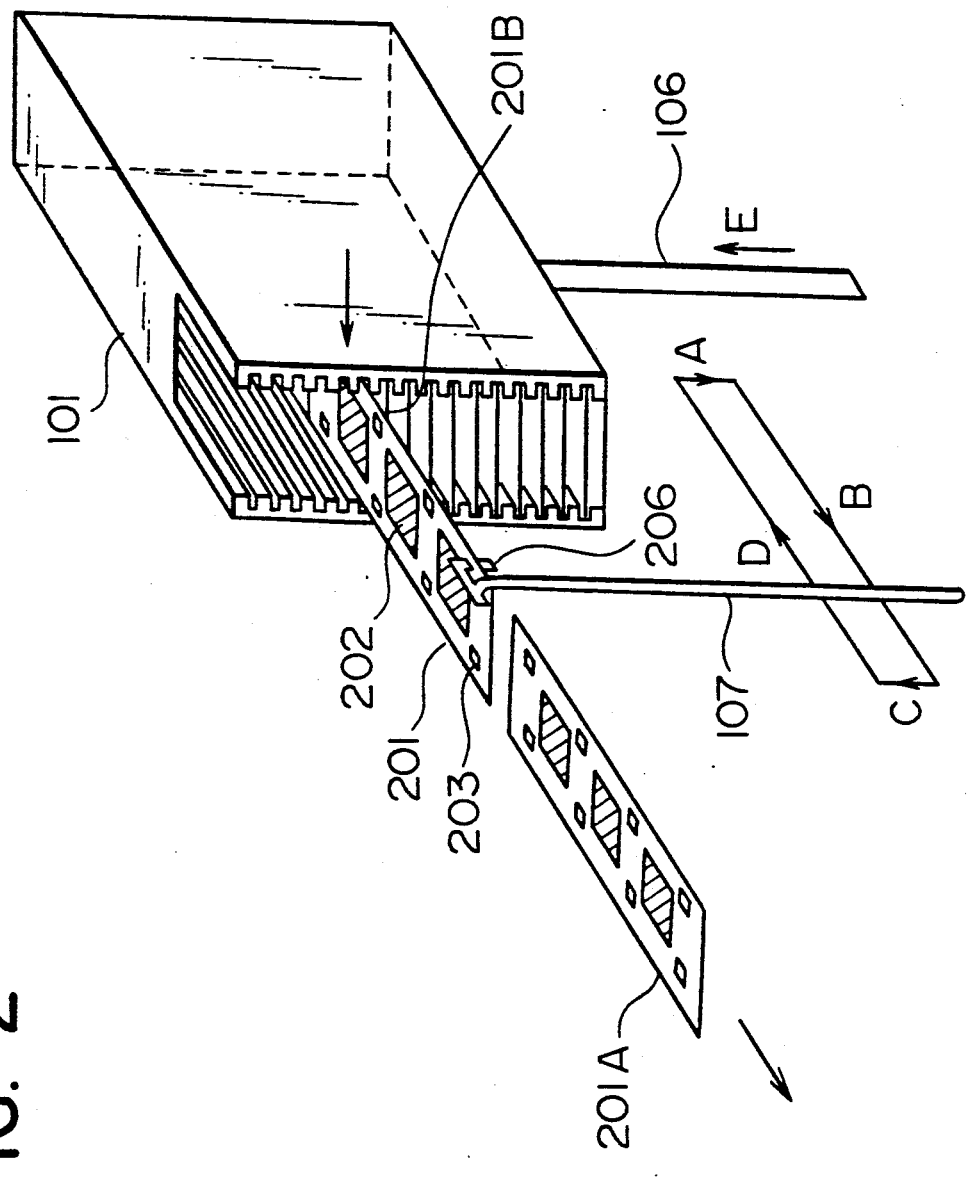
FIG. 2 is perspective view of automatic carrying system of FIG. 1 embodiment.

Next, the structure and operation of the respective parts will be described hereinafter. FIG. 2 is a perspective view showing the automatic carrying system (I) 105. Referring to FIG. 2, numeral 201 denotes a lead frame which is to be taken from the lead frame tray 101, numeral 202 denotes each semiconductor chip mounted on the lead frame 201, numeral 203 denotes a plurality of punch holes formed through the lead frame 201, numeral 201A denotes a preceding lead frame which has been taken from the lead frame tray 101 before the lead frame 201, and numeral 201B denotes a succeeding lead frame which is to be taken from the lead frame tray 101 after the lead frame 201. Numeral 206 denotes a hook attached to a top portion of the arm 107 and arranged in engagement with a punch hole 23 of the lead frame 201. As shown in FIG. 2, the arm 107 carries out sequential movements indicated by arrows A, B, C and D, and then the shaft 106 carries out the movement indicated by arrow E such that lead frames are sequentially taken out from the lead frame tray 101.

Namely, with the movement A, the hook 206 of the arm 107 engages with one of the punch holes 203 of the lead frame 201 stored in a pickup position of the lead frame tray 101. Next, with the movement B, the lead frame 201 is horizontally drawn out from the lead frame tray 101. With the movement C, the hook 206 of the arm 107 is disengaged from the punch hole of the lead frame 201. Then, the hook 206 returns to the home position with the movement D. Further, as shown in the figure, with the movement E, the shaft 106 moves upwardly to set the succeeding lead frame 201B stored in the lead frame tray 101 at the pickup position. Again, the arm 107 undergoes the sequential movements A, B, C and D to take or retrieve the lead frame 201B, and the shaft 106 undergoes the movement E to set a next lead frame at the pickup position. Thereafter, these movements are repeated to sequentially feed the lead frame stored in the lead frame tray 101 from top to bottom.

With the movement B, the lead frame 201 is drawn from the lead frame tray 101 and pushes at its forward end the rear end of the preceding lead frame 201A so as to displace the same horizontally through a distance corresponding to the movement B. In this embodiment, by such operation, the arm 107 operates not only to constitute means for retrieving the lead frame 201 from the lead frame tray 101 and setting it on the guide 104, but also it constitutes means for transferring the lead frame 201A disposed on the guide 104 from the automatic carrying system (I) 105 through the photo-CVD device 102 to the automatic carrying system (II) 108.

On the other hand, the automatic carrying system (II) 108 has structure identical to that of the automatic carrying system (I) 105 shown in FIG. 2. However, in this case, the operation is carried out in reverse cycle with respect to the automatic carrying system (I) 105, i.e., the movement of the arm 107 is effected in the reverse direction with respect to the other arm 107 shown with respect to the automatic carrying system (I) 105, i.e., the movement of the arm 107 is effected in the reverse direction with respect to the other arm 107 shown in FIG. 2, and the shaft 106 moves downward. By repeating this movement, lead frames sequentially transferred are stocked successively in the lead frame tray 103 from top to bottom. The operation of the automatic carrying system (I) 105 and the automatic carrying system (II) 108 are numerically controlled precisely by a microcomputer so as to carry out smoothly the above described sequential movements.

Figure 3A:
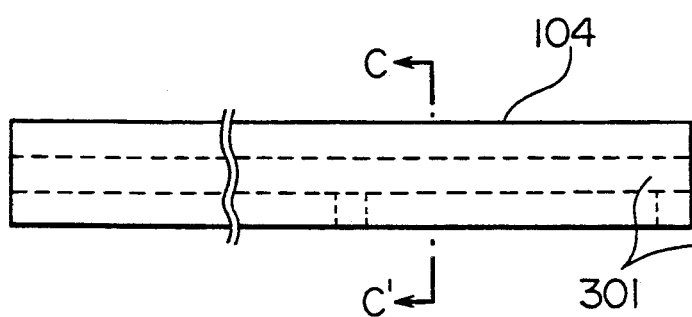
FIGS. 3(a) and 3(b) are a plan view of a guide member of FIG. 1 embodiment and a sectional view thereof taken along line C—C' of FIG. 1.
Figure 3B:
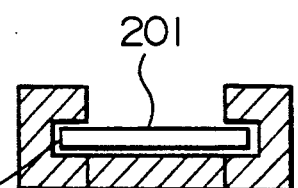

FIG. 3(a) and 3(b) are a front view and a sectional view taken along line C—C', respectively, of the guide or suscepter 104. Referring to FIGS. 3(a) and (b), numeral 301 denotes a rail portion formed in the guide 104. The rail portion 301 has a cross section substantially corresponding to the size of the lead frame 201 with slight clearlance so as to slide the lead frame 201 through the rail portion.

Figure 4:
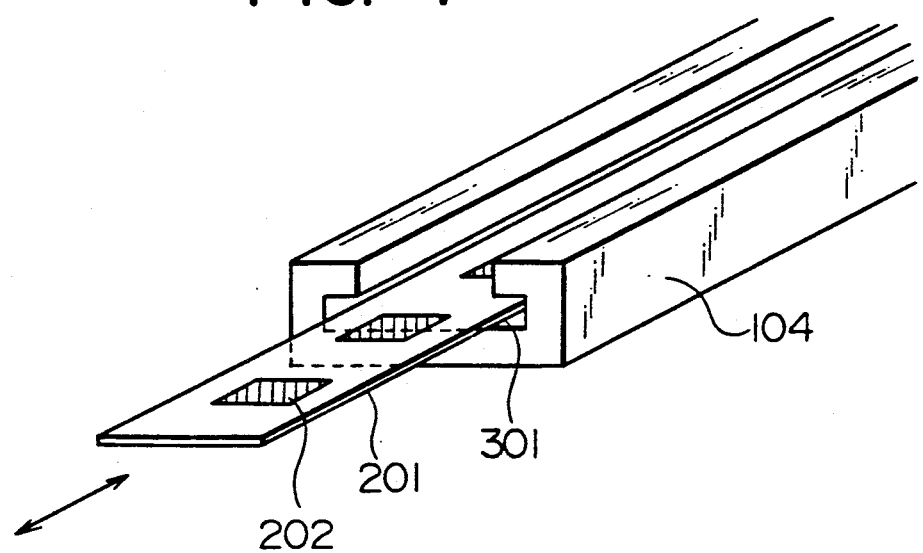
FIG. 4 is a perspective view showing a positional relation of the guide member and lead frame of FIG. 3.

FIG. 4 is a perspective view showing the positional relation between the guide 104 and the lead frame 201. The lead frame 201 is supported by the guide 104 and shifted along the rail portion 301 to slide in the horizontal direction.

FIG. 5 is a sectional view of the photo-CVD device 102 taken along line B—B' of FIG. 1. Referring to FIG. 5, numeral 501 denotes a nitrogen gas ($N_2$) bottle, numeral 502 denotes an $SiH_4$ gas bottle, numeral 503 denotes an $O_2$ gas bottle, numeral 504 denotes a valve, and numeral 505 denotes a flow meter. The photo-CVD device 102 is comprised of a lamp room 109 and a reaction chamber 110, separated spatially from each other by a synthesized quartz window 111. A low pressure mercury-vapor lamp 112 is provided in the lamp room 109. another synthesized quartz window 116 formed with a plurality of tiny holes is provided in the reaction chamber 110 adjacent to the synthesized quartz window 11. Further, the guide 104 is provided to support and shift horizontally the lead frame. Reactive gas discharging openings 117 are disposed adjacently above the guide 104 and a heater 118 is disposed adjacently below the guide 104. An exhaust opening 119 is disposed opposite side relative to the guide 104.

$N_2$ gas is introduced through an $N_2$ gas feeding line 113 between the synthesized quartz window 111 and the synthesized open quartz window 116. Thereafter, the $N_2$ gas is introduced through the plurality of openings formed in the synthesized open quartz window 116 into the reaction chamber 110, then passes through the guide 104, and is discharged from the exhaust opening 119. As described, the $N_2$ gas forms a vertically downward flow within the reaction chamber 110.

$SiH_4$ gas and $O_2$ gas pass through the $SiH_4$ gas feeding line 114 and the $O_2$ gas feeding line 115, respectively, and are discharged onto the lead frame 201 within the reaction chamber 110 through the separate reactive gas discharging nozzles 117, and finally are discharged from the exhaust opening 119. As described, the $SiH_4$ gas and O₂ gas also form vertically downward flow within the reaction chamber 110.

The synthesized quartz window 111, synthesized open quartz window 116, reactive gas discharging openings 117 and exhaust opening 119 are arranged as described above such that the N₂ gas, SiH₄ gas and O₂ gas flow in the vertically downward direction so that the diffusion of SiH₄ gas and O₂ gas is suppressed toward the synthesized quartz window 111 and the synthesized quartz open window 116 so as to completely avoid deposition of the reactive products onto the synthesized quartz closed window 111 and the synthesized quartz open window 116. With using the above described photo-CVD device 102, SiO₂ film is formed on a surface of the lead frame 201 disposed on the guide 104.

At first, 1200 sccm of N₂ gas is flown to form steady flow of the N₂ gas. Next, the heater 118 is operated to heat the lead frame 201 at 200° C. Lastly, 20 sccm of the SiH₄ gas and 1000 sccm of the O₂ gas are flown and the low pressure mercury-vapor lamp 112 is turned on. The pressure is held atmospheric within the reaction chamber 110. By turning on the low pressure mercury-vapor lamp 112, the O₂ gas is photo-dissociated to react with the SiH₄ gas to thereby form SiO₂ film on the lead frame 201. The rate of film growth is about 40 μm/min under the above described film growth condition.

In the above described first embodiment according to the present invention, SiO₂ film growth process can be carried out quickly on the surface of the lead frame after the bonding step by cassette-to-cassette using the lead frame tray according to the following procedure.

At first, the automatic carrying system (I) 105 is provided with the lead frame tray 101 which stores lead frames after the bonding step, and the automatic carrying system (II) 108 is provided with an empty lead frame tray 03. Next, the film growth condition is set to enable the photo-CVD device 102 to prepare for the film growth. Then, the automatic carrying system (I) 105 operates to feed lead frames at given time interval from the lead frame tray 101 to the photo-CVD device 102, and at the same time the photo-CVD device 102 carries out the SiO₂ film growth process on the lead frames, which are stored into the lead frame tray 103 by the automatic carrying system (II).

For example, the film growth rate is set to 40 μm/min by the photo-CVD device 102. The automatic carrying system (I) 105 feeds an individual lead frame every 5 minutes to set the stay interval of 5 minutes for each lead frame within the reaction chamber 110 of the photo-CVD device 102 so that the SiO₂ film of 200 μm thickness is formed successively on each of the lead frames. Lastly after the lapse of a given time period, the lead frame tray 103 is stored with the lead frames subjected to the SiO₂ film growth process. Thus the lead frame tray 103 can be transported to next work station for the step of the resin encapsutation working.

The first embodiment is provided with 5 working lines; however, the number of lines is not limited to 5 but may be increased to boost the processing capacity.

Figure 6A:
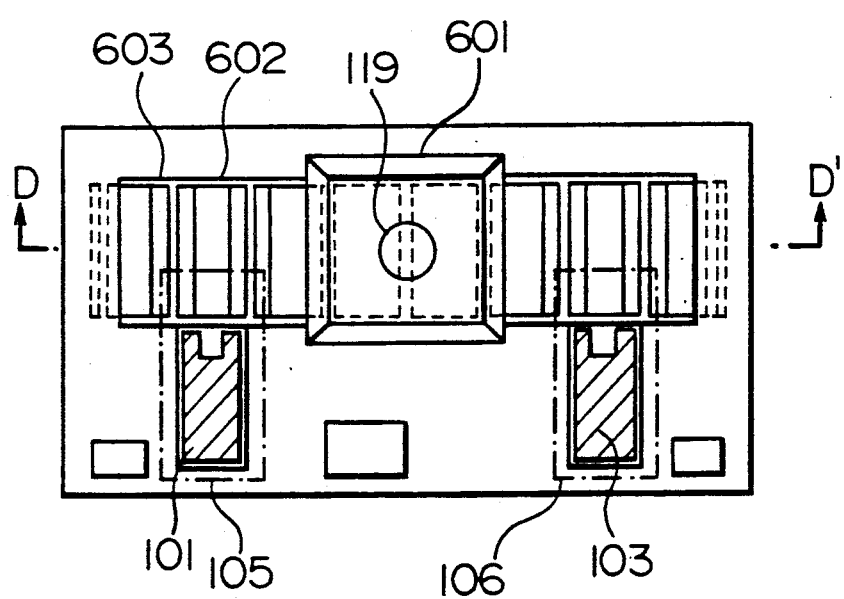
FIG. 6(a) is a plan view of a second embodiment according to the present invention.
Figure 6B:
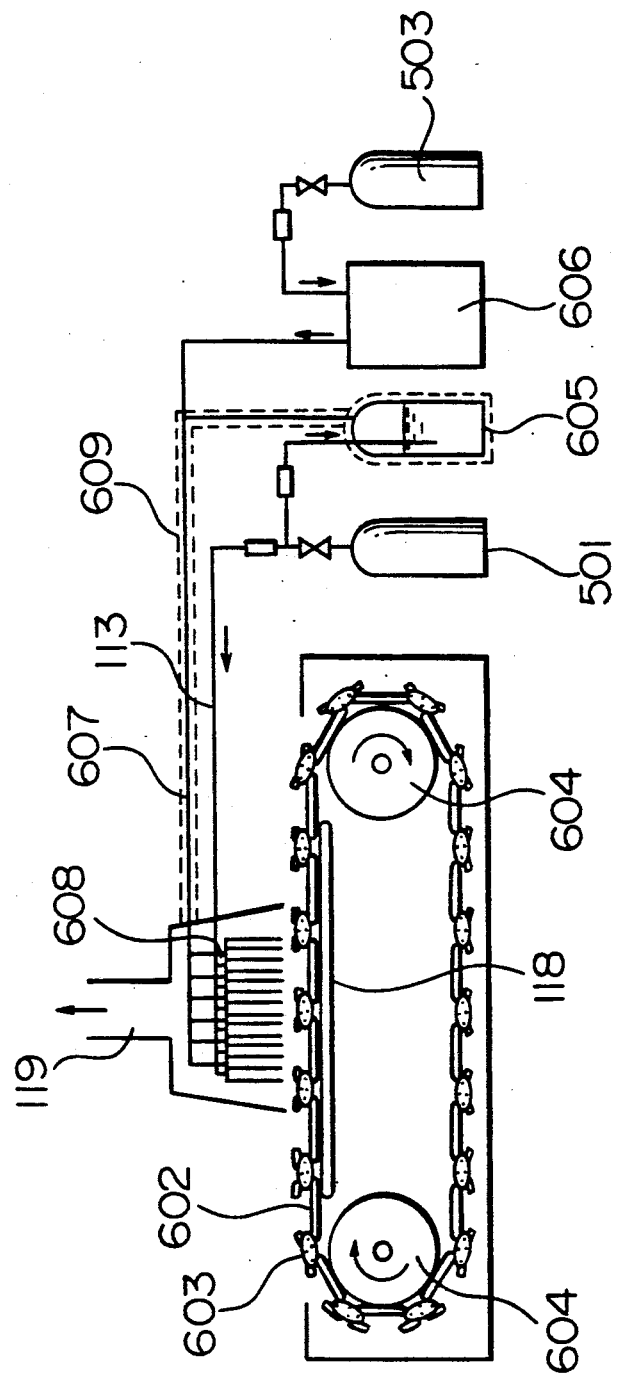
FIG. 6(b) is a sectional view of the second embodiment taken along line D—D' of FIG. 6(a)

FIGS. 6(a) and 6(b) show a plan view and a sectional view taken along line D—D', respectively, of an atmospheric pressure CVD device used in a second embodiment according to the present invention. Referring to FIGS. 6(a) and 6(b), numeral 601 denotes the atmospheric pressure CVD device, numeral 602 denotes a guide, numeral 603 denotes a coupling member, numeral 604 denotes a rotational wheel, numeral 605 denotes a tetraethoxysilane (TEOS) bubbler, numeral 606 denotes a discharge type ozone generator, numeral 607 denotes a reactive gas feeding pipe, numeral 608 denotes a reactive gas introducing opening and numeral 609 denotes a heater.

Figure 7:
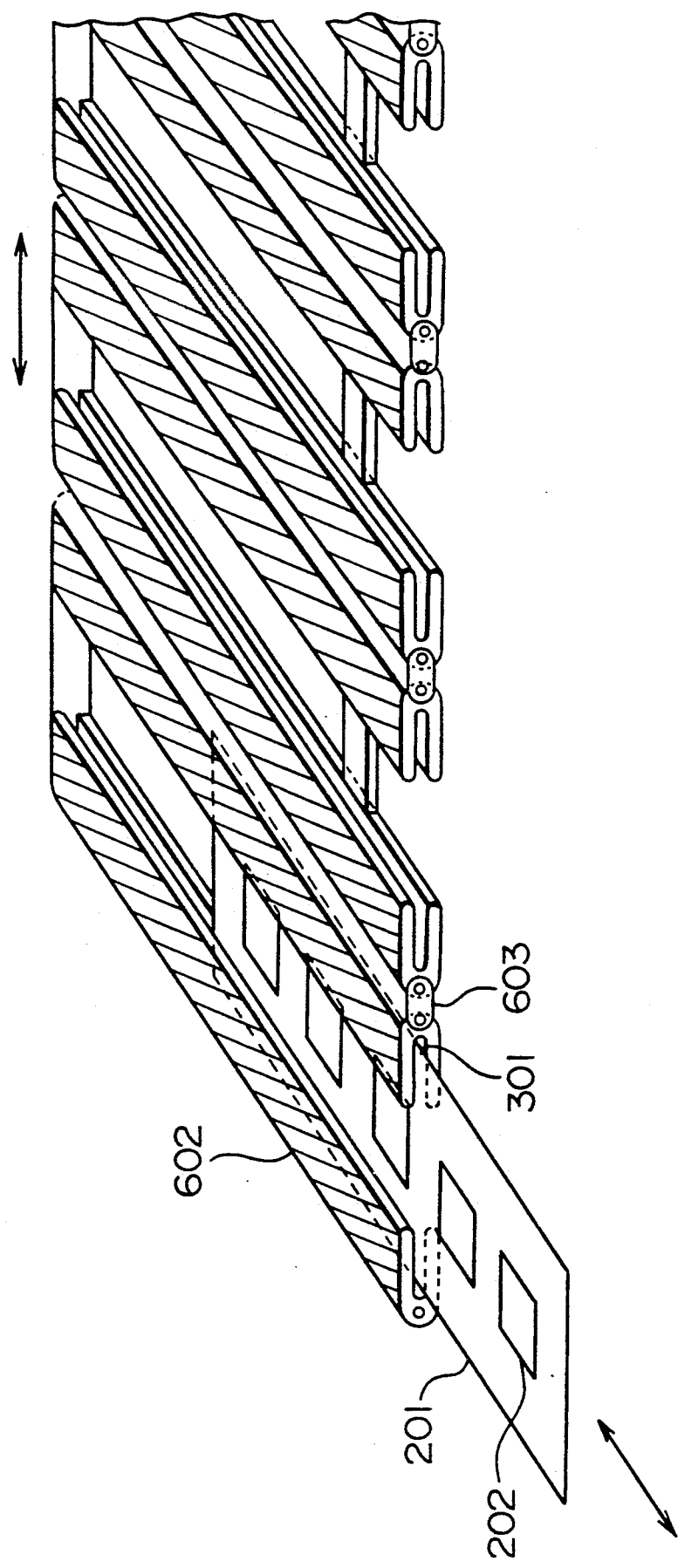
FIG. 7 is a perspective view of a guide member of FIG. 6(a)

As shown in FIG. 7, the guide 602 for the lead frame used in the second embodiment is arranged such that the plurality of guides 602 formed with a rail portion 301 are coupled by the coupling members 603 with each other in the caterpillar tread form. The lead frame 201 is slid along the rail portion 301 of each guide 602 to attach to and detach from the guide 602.

In the second embodiment, the growth process of the insulating film on the surface of the lead frame is carried out according to the following procedure. At first, the atmospheric pressure CVD device 601 shown in FIG. 6 is set to a film growth operation mode. For this, the heater 118 is activated to 200° C.–250° C. Next, 1200 sccm of N₂ gas flows so as to bubble TEOS heated at 100° C. by 50 sccm of N₂ gas. At the same time, 200 sccm of O₂ gas is passed through the discharge type ozone generator 606 to produce ozone O₃. Then, N₂ gas, TEOS gas and O₃ gas are injected onto the surface of the lead frame disposed on the guide 602, from the reactive gas injecting nozzles 608 under the heated state. The reactive gas injected onto and applied to the lead frame surface is immediately discharged from the exhaust opening 119. Under such conditions, the SiO₂ film growth can be effected at the growth rate of 2000Å/min on the surface of the lead frame 201.

According to the above procedure, after setting the admospheric pressure CVD device 601 in the film growth mode, the automatic carrying system (I) 105 is provided with the lead frame tray 101 which stocks lead frames subjected to the bonding step as shown in FIG. 1. The automatic carrying system (II) 108 is provided with the empty lead frame tray 103. The automatic carrying system (I) 105 operates to draw a lead frame from the lead frame tray 103 to feed it to the guide 602. Next, the wheel 604 is rotated to drive the entire caterpillar tread structure of the guides 602 so as to shift a next empty guide to the position corresponding to the automatic carrying system (I). Concurrently with the rotation of the wheel 604, each guide or susceptor 602 is shifted to the position corresponding to the automatic carrying system (II) 108. The automatic carrying or pickup system (II) 108 operates to draw the lead frame finished with the SiO₂ film growth process and to set it to the lead frame tray 103. By repeating the above operation, each lead frame can be sequentially treated with the SiO₂ film growth process.

In this embodiment, the structure of the automatic carrying system (I) 105 and the automatic carrying system (II) 108 can be identical to that described in the first embodiment. In order to carry out smoothly the above operation, it is desirable to numerically control the automatic carrying system (I) 105, automatic carrying system (II) 108 and the rotary wheel 604 by, for example, a microcomputer. In addition, the rotation speed of the rotary wheel 604 is determined according to the growth rate of SiO₂ film in the atmospheric pressure CVD device 601 and the SiO₂ film thickness to be formed on the lead frame surface.

Figure 8:
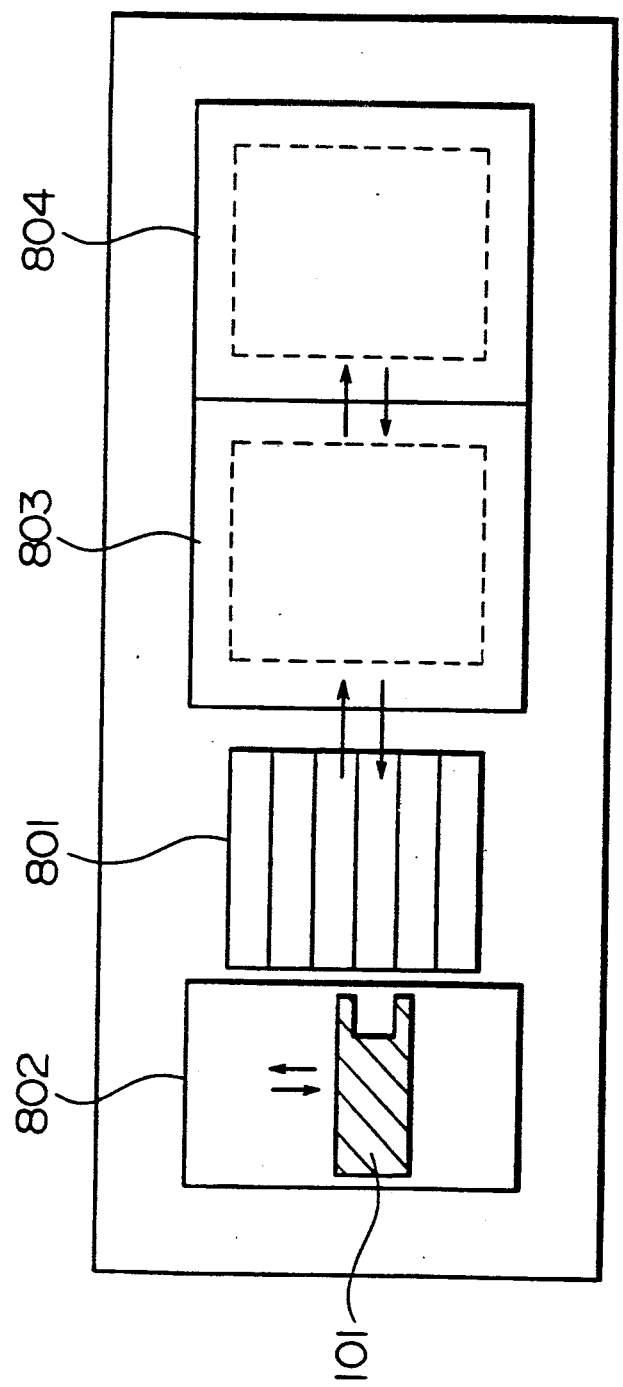
FIG. 8 is a plan view of a third plan view according to the present invention.

FIG. 8 is a plan view showing structure of a third embodiment according to the present invention. Referring to FIG. 8, numeral 801 denotes a guide, numeral 802 denotes an automatic carrying system for carrying a lead frame 101 to and from the guide 801, numeral 803 denotes a load lock chamber and numeral 804 denotes a reduced pressure or vacuum CVD device.

Figure 9:
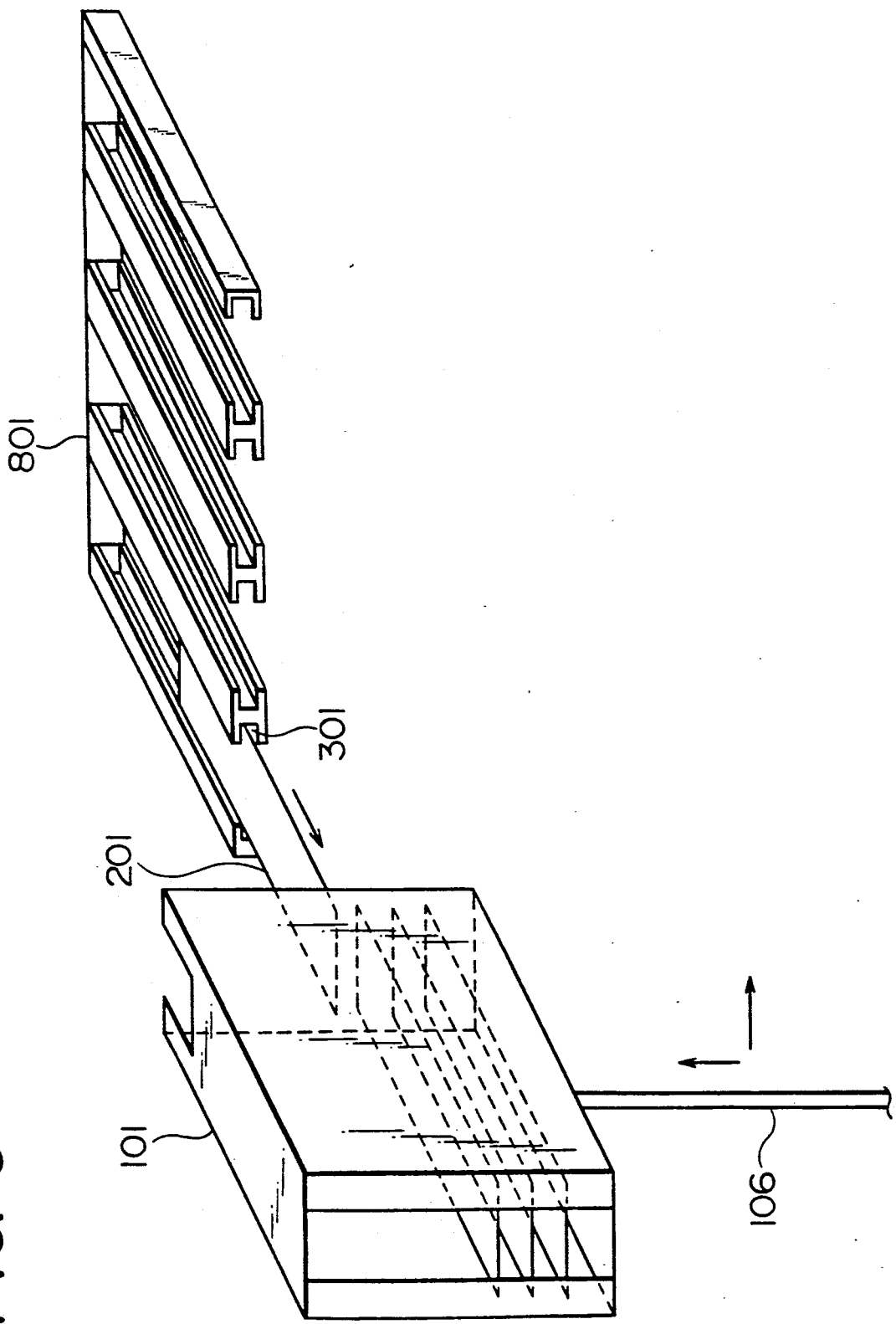
FIG. 9 is a perspective view of guide member and automatic carrying system of FIG. 8.

As shown in FIG. 9, in the third embodiment, the guides 801 having a rail portion 301 are arranged in parallel so as to store a plurality of the lead frames in the same plane. The shaft 106 which holds the lead frame tray 101 is displaced vertically and horizontally so as to draw horizontally lead frames 201 stored in the lead frame tray 101 to thereby successively feed them to the guides 801. On the other hand, the lead frames 201 stored in the guides 81 are horizontally drawn to stock them into the lead frame tray 101. A mechanism utilizing an arm 107 as shown in the first embodiment can be used to charge and discharge the lead frame 201.

As described above, in the third embodiment, the automatic carrying system 802 comprised of the shaft 106 and the arm 107 operates to take the lead frame 201 from the lead frame tray 101 and to set the same on the guide 801, and operates to take the lead frame 201 from the guide 801 and to return it to the lead frame tray 101.

The insulating film growth process is carried out on the lead frame surface according to the following procedure in the third embodiment. At first, the automatic carrying system 802 shown in FIG. 8 is loaded with a lead frame tray 101 which stores lead frames finished in the bonding step. Next, the automatic carrying system 802 operates to sequentially feed the lead frames to the guide 801. The guide 801 which mounts the lead frames is transferred to the load lock chamber 803 and the load lock chamber 803 is evacuated. Thereafter, the lead frames are fed into the vacuum CVD device 804. The insulating film growth process is carried out at a given film thickness within the vacuum CVD device 804. Then the guide or receiver 801 is returned to the load lock chamber 803. The load lock chamber 803 is leaked to the atmosphere. The receiver 801 is fed from the load lock chamber 803. Then the automatic carrying system 802 operates to transfer sequentially the lead frames from the receiver to the lead frame tray 101.

In this embodiment, a transfer system numerically controlled by a microcomputer is utilized to smoothly effect the transfer of the receiver 801 to the load lock chamber 803 and between the load lock chamber 803 and the vacuum CVD device 804. In addition, the vacuum CVD device 804 has a structure similar to that of the photo-CVD device of the first embodiment and functions to evacuate the chamber. In such case, reactive gases of SiH4 and ammonia (NH3) are utilized to form silicon nitride film (Si3N4) which is more moisture-resistant than the SiO2 film.

The third embodiment has merits, as compared to the first and second embodiment, that the receiver 801 can be easily detached in view of the device structure and therefore the receivers 801 of various sizes corresponding to the dimension of different lead frames can be easily exchanged so as to treat the various lead frames of different dimensions.

Figure 10A:
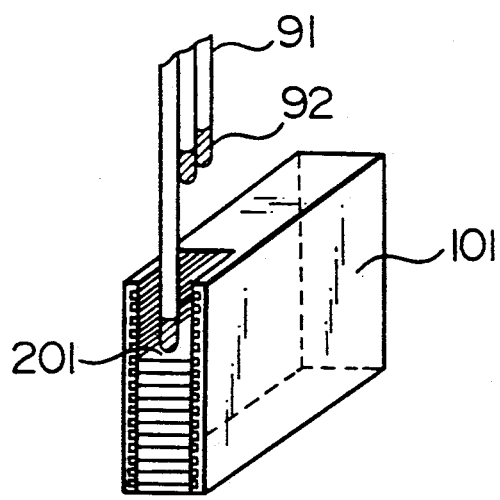
FIGS. 10(a), 10(b), and 10(c) are a perspective view of a fourth embodiment according to the present invention.
Figure 10B:
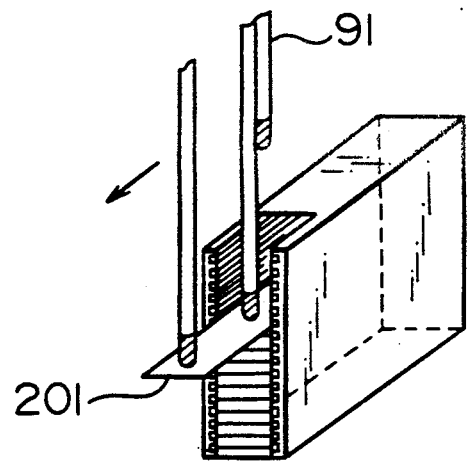
Figure 10C:
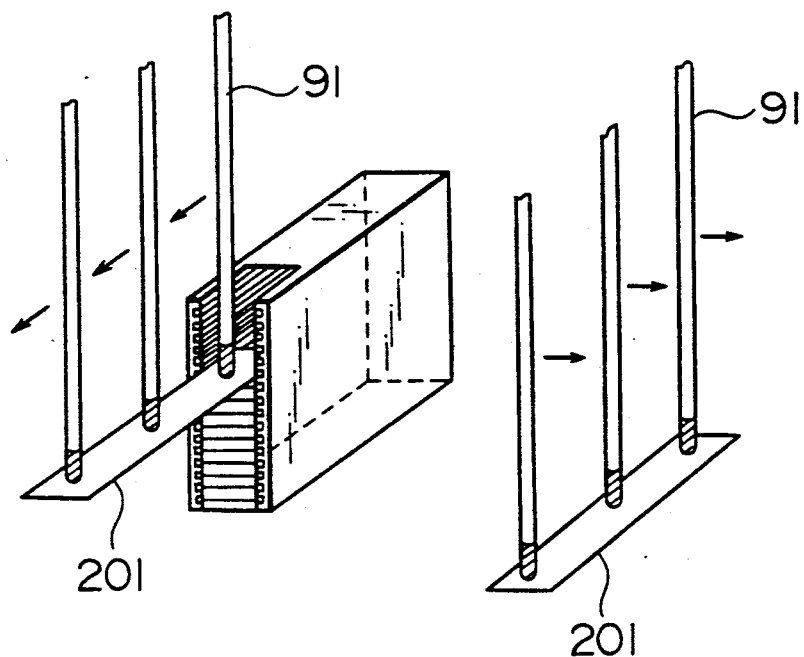
Figure 10:
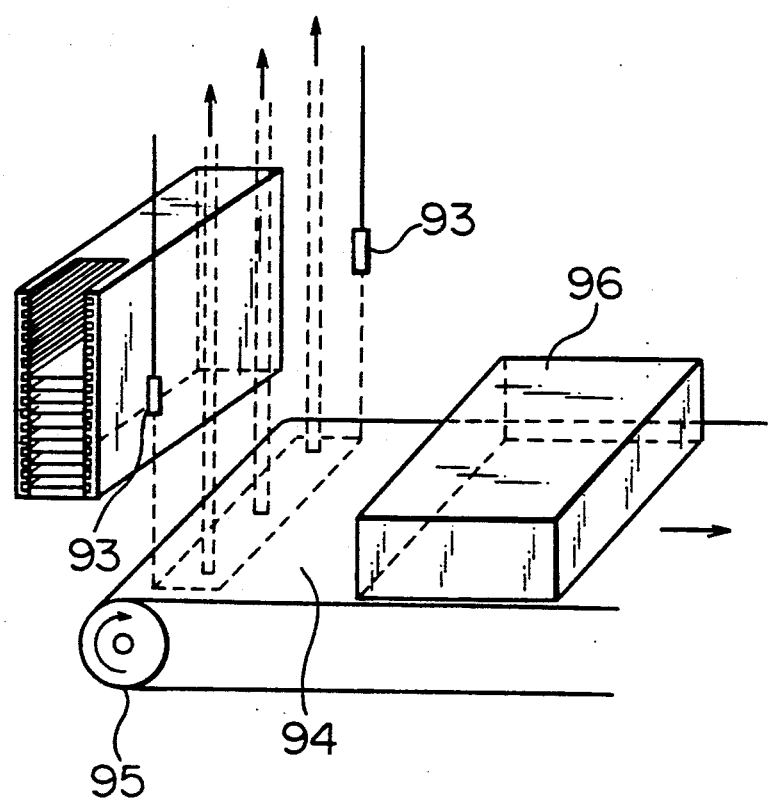

FIG. 10 is a perspective view showing a fourth embodiment according to the present invention. Numeral 91 denotes a shaft, numeral 92 denotes an electromagnet fixed to a tip of the shaft 91, numeral 93 denotes an optical sensor for detecting a position of a lead frame 201, numeral 94 denotes a receiver or suscepter 94 made of flexible metal mesh, numeral 95 denotes a rotary wheel for displacing the receiver 94, and numeral 96 denotes an atmospheric pressure $\subset$ 'D device for carrying out insulating film growth process.

The insulating film growth process is carried out on the lead frame 201 according to the following procedure in the fourth embodiment. At first, as shown in FIG. 10 (a), the first shaft 91 is vertically lowered to come into contact with the surface of the lead frame 201 to thereby enable the electromagnet 92 to attract the lead frame. Next, as shown in FIG. 10(b), the first shaft 91 is horizontally displaced so that the center of the lead frame 201 is brought just under the second shaft 91 so as to draw the lead frame. Thereafter, the second shaft 91 is attracted to the center of the lead frame 201.

Further, as shown in FIG. 10(c), the first and second shafts 91 are horizontally displaced and then the third shaft 91 is vertically lowered to attract the lead frame. Then, the three shafts 91 are horizontally displaced to draw the lead frame 201 completely from the lead frame tray 101. Lastly, as shown in FIG. 10(d), the three shafts 91 are displaced in parallel to position the lead frame 201 on the receiver 94, and then the three electromagnets are deenergized and the three shafts are returned to their home position. In this operation, the optical sensor 93 operates to determine the precise position of the lead frame on the receiver 94.

When the lead frame 201 is disposed on the receiver 94, the rotary wheel 95 rotates to transfer the lead frame 201 to the atmospheric pressure CVD device 96. The atmospheric pressure CVD device 96 may be comprised of a photo-CVD device 102 used in the first embodiment and operative to carry out the insulating film growth at low temperature under atmospheric pressure, or an atmospheric pressure CVD device 601 used in the second embodiment and provided with an ozone generator. The lead frame 201 subjected to the insulating film growth process within the atmospheric pressure CVD device 96 is transferred through the receiver 94 and fed to the automatic carrying system. The automatic carrying system operates to store the lead frame 201 into an empty lead frame tray. As described, by repeating the sequential operation, the lead frames stored in the lead frame tray 101 after finishing the bonding step are sequentially subjected to the insulating film growth process and stocked into another lead frame tray.

In order to take the lead frame from the receiver 94 and to set it into the lead frame tray, the automatic carrying system may have structure quite identical to that of the automatic carrying system shown in FIG. 10 and comprised of shafts 91, corresponding electromagnets 92 and an optical sensor 93, and may operates reversely.

The fourth embodiment has an advantage since the operation of the shafts 91 is numerically controlled by an microcomputer. The dimensional data of the lead frame can be changed on the software inputted into the microcomputer so as to treat different size of the lead frames.

As described, the four embodiments are explained according to the present invention. The combination of the suscepter, thin film growing or forming means and the automatic carrying means of the lead frame is not limited to the above described embodiments. For example, the suscepter and the automatic carrying means of the first embodiment can be combined with the atmospheric pressure CVD device of the second embodiment.

Further, a transfer means for the lead frame disposed on the suscepter is not limited to those used in the above described embodiments. For example, the suscepter 801 of the third embodiment can be used in place of the suscepter 94 of the fourth embodiment to effect the transfer.

Moreover, the vacuum CVD device 804 of the third embodiment is not limited to the photo-CVD device, but may be composed of a CVD device of the type provided with an ozone generator for growing $SiO_2$ film from the organic silicon compound under the reduced pressure. The CVD device of the up face type is used in all of the above described embodiments, but a CVD device of the down-face type can be utilized in an up-side-down structure of the entire device so as to reduce the deposition of particles on the lead frame surface during the film growth.

As described above, according to the present invention, the thin film forming means is provided with the first automatic carrying means for taking a lead frame from a lead frame tray and setting it on a suscepter, the second automatic carrying means for taking the lead frame and setting it into the lead frame tray, and the transfer means for transferring the lead frame disposed on the suscepter from the first automatic carrying means to the thin film forming means and then transferring the lad frame from the thin film forming means to the second automatic carrying means. By such a construction, the insulating film forming process can be carried out on the surface of the lead frame; finished in the bonding process by means of a lead frame tray in cassette-to-cassette process to thereby realize a fast and productive assembling or fabrication of semiconductor device.

What is claimed is:

1. An apparatus for producing semiconductor devices, said apparatus comprising: a first lead frame tray for storing a lead frame which has semiconductor chips mounted on it; a susceptor; first automatic carrying means for taking said lead frame from said first lead frame tray and for setting the lead frame on said susceptor; thin film forming means having a CVD device taken from a group consisting of a photo CVD device and an atmospheric pressure CVD device having an ozone generator, said forming means forming an insulating film on a surface of said lead frame disposed on said susceptor; second automatic carrying means for taking said lead frame from said susceptor after said insulating film is formed and for setting said lead frame having the insulating film formed thereon into a second lead frame tray; and transferring means for transferring said lead frame disposed on the susceptor from said first automatic carrying means through said thin film forming means to said second automatic carrying means.

2. An apparatus for producing semiconductor devices, said apparatus comprising: a lead frame tray for storing a lead frame which has semiconductor chips mounted on it; a susceptor for conveying said lead frame; first automatic carrying means for taking said lead frame from said first lead frame tray and for setting the lead frame on said susceptor; thin film forming means having a CVD device taken from a group consisting of a photo CVD device, and an atmospheric pressure CVD device having an ozone generator, said CVD device forming an insulating film on a surface of said lead frame disposed on said susceptor; second automatic carrying means for taking said lead frame from said susceptor after said insulating film is formed and for setting said lead frame with the insulating film formed thereon into said lead frame tray; and transferring means for transferring said susceptor between said lead frame tray and said thin film forming means.

3. An apparatus for producing semiconductor device as claimed in claim 2, wherein susceptor 602 for a lead frame is arranged such that coupled members 603 couple a plurality of rail portions 301 of susceptor 602 in a caterpillar tread form.

4. An apparatus for producing semiconductor devices as claimed in claim 2, wherein susceptor 801 has rail portions 301, said rail portions 301 being arranged in parallel so as to store a plurality of the lead frames 201 in the same plane respectively.

5. An apparatus for producing semiconductor devices, said apparatus comprising: a first lead frame tray 101 for storing a lead frame which has semiconductor chips mounted on it, a photo-CVD device 102 for forming an insulating film on said lead frame, a second lead frame tray 103 for storing said lead frame having the insulating film in the photo-CVD device 102, a susceptor 104 having a rail with a shape which is operative to slide said lead frame mounted semiconductor chips in order to transfer the same from said first lead frame tray 101 through the photo-CVD device 102 to said second lead frame tray 103, a first automatic carrying system including a shaft 106 for moving said first lead frame tray 101 in a vertical direction, and an arm 107 for feeding a lead frame from the lead frame tray 101 to the susceptor 104 in a horizontal direction, whereby a lead frame can be taken from said first lead frame tray 101 and placed on said susceptor 104, and second automatic carrying system 108 including a shaft 106 for moving said second lead frame tray 103 in the vertical direction, and an arm 107 for feeding a lead frame from said susceptor 104 to the lead frame tray 103 in the horizontal direction, taking a lead frame from said susceptor 104 and storing it into said second lead frame tray 103.

6. An apparatus for producing semiconductor devices as claimed in claim 5, and means for enabling the shafts 106 to carry out a sequential movement.

7. An apparatus for producing semiconductor devices as claimed in claim 5, wherein the susceptor 104 is formed with a rail portion having a cross-section substantially corresponding to the size of the lead frame with a slight clearance so as to slide the lead frame 201 through said rail portion.

8. An apparatus for producing semiconductor devices as claimed in claim 5, wherein the first automatic carrying system is comprised of a shaft 91, an electromagnet 92 fixed to a tip of the shaft 91, an optical sensor 93 for detecting a position of a lead frame 201, a susceptor 94 made of a flexible metal mesh and a rotary wheel 95 for displacing the susceptor 94.

* * * * *